United States Patent
Peuser

(10) Patent No.: US 9,088,159 B2
(45) Date of Patent: Jul. 21, 2015

(54) LIMITING CIRCUIT FOR A SEMICONDUCTOR TRANSISTOR AND METHOD FOR LIMITING THE VOLTAGE ACROSS A SEMICONDUCTOR TRANSISTOR

(71) Applicant: Robert Bosch GmbH, Stuttgart (DE)

(72) Inventor: Thomas Peuser, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/013,475

(22) Filed: Aug. 29, 2013

(65) Prior Publication Data

US 2014/0070877 A1 Mar. 13, 2014

(30) Foreign Application Priority Data

Sep. 12, 2012 (DE) .......................... 10 2012 216 185

(51) Int. Cl.
| | |
|---|---|
| *H03K 5/08* | (2006.01) |
| *H02H 3/20* | (2006.01) |
| *H02H 7/22* | (2006.01) |
| *H03K 17/0812* | (2006.01) |
| *H03K 17/082* | (2006.01) |

(52) U.S. Cl.
CPC ................ *H02H 3/20* (2013.01); *H02H 7/222* (2013.01); *H03K 17/0828* (2013.01); *H03K 17/08128* (2013.01)

(58) Field of Classification Search
CPC ... H02H 3/20; H02H 7/222; H03K 17/08128; H03K 17/028

USPC ......... 327/309, 310, 313, 314, 324, 325, 326, 327/327, 328

See application file for complete search history.

(56) References Cited

U.S. PATENT DOCUMENTS

| | | | | |
|---|---|---|---|---|
| 6,087,877 | A * | 7/2000 | Gonda et al. ................... | 327/309 |
| 7,310,006 | B2 * | 12/2007 | Shimada ........................... | 326/83 |
| 7,636,005 | B2 * | 12/2009 | Nadd ............................ | 327/309 |
| 7,924,084 | B2 * | 4/2011 | Kojima ......................... | 327/427 |
| 7,940,503 | B2 * | 5/2011 | Volke ........................... | 361/91.1 |
| 2001/0017783 | A1 | 8/2001 | Bruckmann et al. | |

FOREIGN PATENT DOCUMENTS

EP          0730331          8/1999

* cited by examiner

*Primary Examiner* — Jeffrey Zweizig
(74) *Attorney, Agent, or Firm* — Michael Best & Friedrich LLP

(57) ABSTRACT

A limiting circuit for at least one semiconductor transistor. The circuit includes a limiting path which is coupled between a first power terminal and a second power terminal of the semiconductor transistor. The limiting path includes a limiting transistor. A node of the limiting path located between the limiting transistor and the second power terminal of the semiconductor transistor is coupled to a control terminal of the semiconductor transistor. A voltage source is coupled to the control terminal of the limiting transistor and is designed to apply a control voltage to said control terminal of the limiting transistor. The control voltage corresponds to a critical voltage for the voltage between the first power terminal and the second power terminal of the semiconductor transistor. The limiting transistor is switched to a conductive state when said critical voltage is exceeded at a power terminal of said limiting transistor.

10 Claims, 3 Drawing Sheets

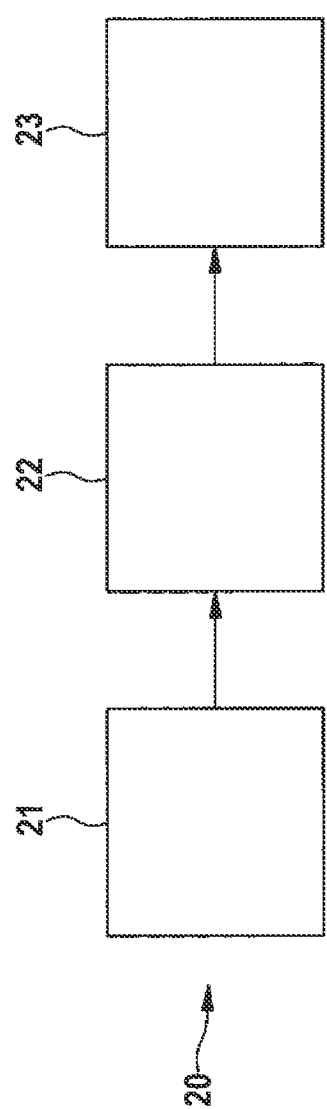

LIMITING CIRCUIT FOR A SEMICONDUCTOR TRANSISTOR AND METHOD FOR LIMITING THE VOLTAGE ACROSS A SEMICONDUCTOR TRANSISTOR

BACKGROUND OF THE INVENTION

The invention relates to a limiting circuit for a semiconductor transistor and a method for limiting the voltage across a semiconductor transistor, in particular for power semiconductor switches, such as IGBTs, JFETs or MOSFETs.

Power transistors are used as switching elements in inverter systems, for example in high voltage networks of electrical drive systems of motor vehicles. Said power transistors have to have a certain dielectric resistance to voltage peaks that occasionally occur, which, for example, can be caused by leakage inductances in the drive system.

In order to absorb said voltage peaks and to protect the power transistors from damage, limiting circuits ("active clamp") can be used which temporarily activate the power transistor when electrical surges occur and thereby convert the mostly low-energy voltage peaks into heat via the partially short-circuited power path of the power transistor.

The European patent publication EP 1 110 035 A1 discloses a limiting circuit for a power semiconductor switch, in which a limiting path comprising a plurality of Zener diodes is configured, wherein the reference voltage can be graded by selective bridging of the Zener diodes. Finally, the European patent publication EP 0 730 331 B1 discloses a limiting circuit for a power transistor, in which a voltage divider emits a control signal from the center tap thereof to the gate of the power transistor when an electrical surge occurs, said gate temporarily activating the power transistor.

There is a need for options to limit the voltage over semiconductor transistors effectively, reliably and exactly as possible in order to protect said semiconductor transistors from voltage peaks that might arise.

SUMMARY OF THE INVENTION

In one respect, the present invention creates a limiting circuit for at least one semiconductor transistor having a limiting path which is coupled between a first power terminal and a second power terminal of the semiconductor transistor and which comprises a limiting transistor, wherein a node of the limiting path between the limiting transistor and the second power terminal of the semiconductor transistor is coupled to a control terminal of the semiconductor transistor. Said semiconductor transistor further comprises a voltage source which is coupled to the control terminal of the limiting transistor and which is designed to apply a control voltage to the control terminal of the limiting transistor, said control voltage corresponding to a critical voltage for the voltage between the first power terminal and the second power terminal of the semiconductor transistor. In the event said critical voltage is exceeded at a power terminal of the limiting transistor, the limiting transistor is switched to the conductive state.

In another respect, the present invention creates a method for limiting a voltage across a semiconductor transistor. The inventive method comprises the first step of applying a control voltage to the control terminal of a limiting transistor which corresponds to the critical voltage for the voltage between the first power terminal and the second power terminal of the semiconductor transistor, wherein the limiting transistor is switched to the conductive state if said critical voltage is exceeded. The inventive method further comprises the second step of coupling the control terminal of the semiconductor transistor via the conductive limiting transistor to the first power terminal of said semiconductor transistor.

In a further respect, the present invention creates a circuit arrangement comprising a plurality of semiconductor transistors and a limiting circuit according to the invention, the node of the limiting path of said limiting circuit being coupled to each of the control terminals of the plurality of semiconductor transistors.

The idea behind the present invention is to specify a limiting circuit ("active clamp") for a semiconductor transistor, in which circuit the critical voltage, above which a voltage across a semiconductor transistor may not lie, can be set very precisely. To this end, a limiting transistor, which can be actuated via a control voltage at the control terminal, is used in the limiting path instead of a Zener diode, the breakdown voltage of which can be set only relatively imprecisely, in order to temporarily short-circuit the control terminal of the semiconductor transistor to the collector element in the event that electrical surges above the critical voltage occur. This allows for the electrical surges to be suppressed across the power path of the semiconductor transistor.

The control voltage thereby corresponds to the critical voltage; thus enabling the limiting transistor to become conductive if the voltage at a power terminal of the limiting transistor exceeds the control voltage or, respectively, the critical voltage. As a result, the limiting transistor is switched to the conductive state and temporarily short-circuits the control terminal of the semiconductor transistor to the collector terminal. The limiting transistor therefore acts like a fuse element having an adjustable short-circuit threshold value. In comparison to Zener diodes, said threshold value can be very precisely adjusted via the control voltage.

This has the advantage that the critical voltage across the limiting transistor can be very accurately set; thus enabling the safety margin for the dielectric resistance to be accordingly selected lower. As a result, semiconductor surface area on the transistor chips can be eliminated, which considerably reduces the manufacturing costs, in particular in arrangements having a large number of semiconductor transistors, such as, for example, inverter or battery direct inverter systems in electrical drive systems of motor vehicles.

In addition, there is the advantage that the components which are used for the limiting circuit are themselves very cost effective and can thereby further reduce the manufacturing costs.

Alternatively, there is also the advantage in the case of the semiconductor transistors having the same dielectric strength that a higher nominal voltage can be allowed between the power terminals without incurring the risk of damage to the semiconductor transistors.

According to one embodiment of the inventive limiting circuit, the semiconductor transistor can be an IGBT, the first power terminal a collector terminal and the second power terminal an emitter terminal of the IGBT.

According to an alternative embodiment of the inventive limiting circuit, the semiconductor transistor can be a MOSFET, the first power terminal a drain terminal and the second power terminal a source terminal of the MOSFET.

According to a further embodiment of the inventive limiting circuit, the voltage source can comprise a boost converter which is designed to boost a supply voltage to an input terminal of the boost converter to a control voltage from the limiting transistor.

According to a further embodiment of the inventive limiting circuit, the limiting circuit can further comprise a return path which is coupled between the control terminal of the limiting transistor and the second power terminal of the semiconductor transistor and which is designed to reduce the control voltage in accordance with a predeterminable gradient.

According to a further embodiment of the inventive limiting circuit, the limiting transistor can be a MOSFET, an IGBT, a JFET or a BJT.

According to an embodiment of the method according to the invention, the semiconductor transistor can be an IGBT, the first power terminal a collector terminal and the second power terminal an emitter terminal of the IGBT.

According to a further embodiment of the method according to the invention, the limiting transistor can be a MOSFET, an IGBT, a JFET or a BJT.

BRIEF DESCRIPTION OF THE DRAWINGS

Further features and advantages of embodiments of the invention ensue from the following description with reference to the attached drawings.

In the drawings:

FIG. 3 shows a schematic depiction of a method for limiting the voltage across a semiconductor transistor according to a further embodiment of the present invention.

DETAILED DESCRIPTION

Figure 1:
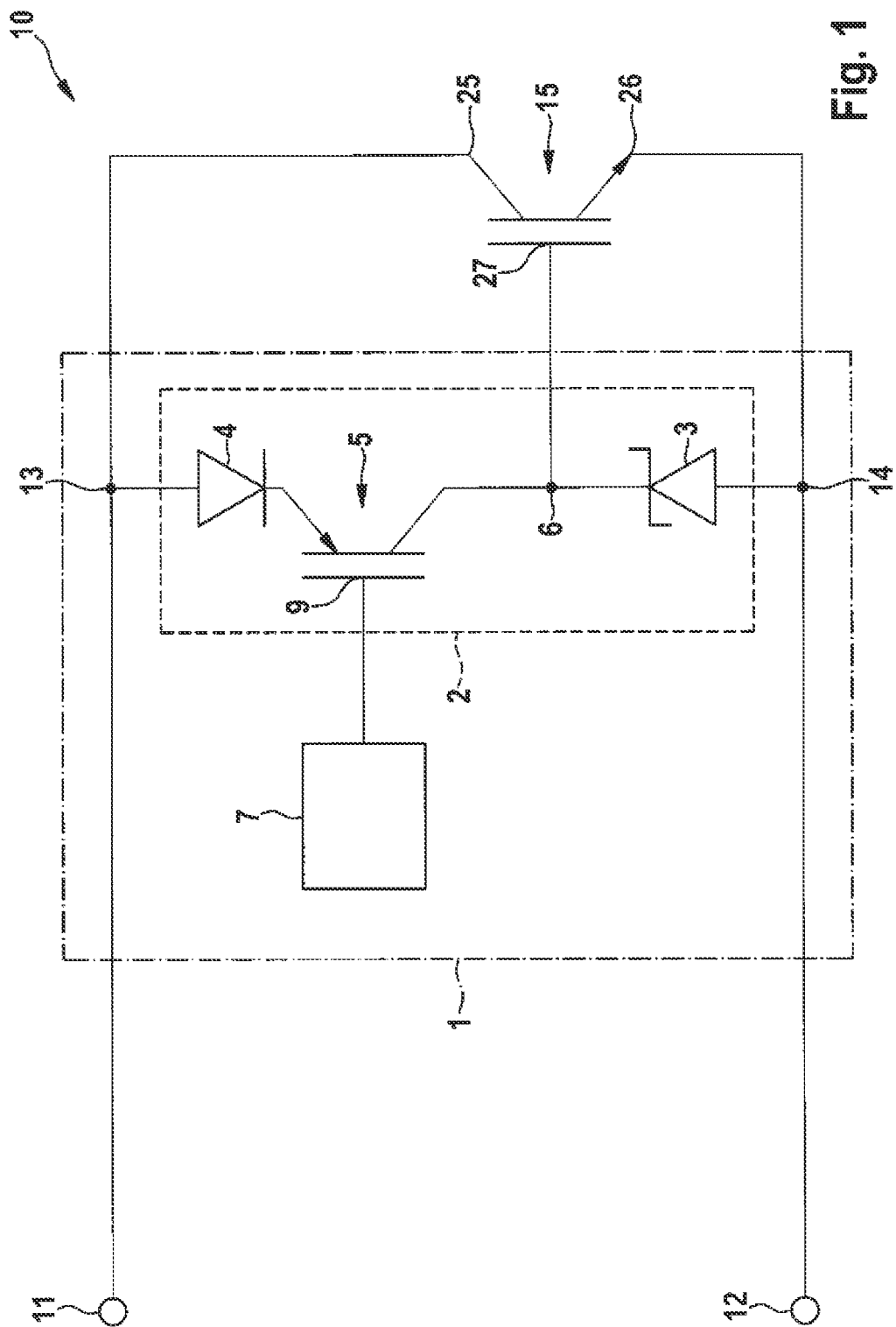
FIG. 1 shows a schematic depiction of a limiting circuit for a semiconductor transistor according to an embodiment of the present invention.

FIG. 1 shows a schematic depiction of a limiting circuit 1 for a semiconductor transistor 15. The circuit arrangement 10 comprises a semiconductor transistor 15 which is coupled by means of the power thereof between two potential connections 11 and 12. The potential connection 11 can, for example, conduct high potential whereas the potential connection 12 can, for example, conduct a reference potential from, for instance, a phase connection. A variable potential difference, which causes a voltage drop across the semiconductor transistor 15, exists between the potential connections 11 and 12. The potential connections 11 and 12 can, for example, be coupled to a voltage supply (not explicitly depicted), for example to a battery or and accumulator or an electric machine.

Parallel to the power path of the semiconductor transistor 15, a limiting path 2 is coupled between the potential connections 11 and 12 between the nodes 13 and 14. The limiting path 2 comprises a series circuit consisting of a blocking diode 4, a limiting transistor 5 and a Zener diode 3 connected in the blocking direction of the blocking diode 4. A node 6 of the limiting path 2 between the limiting transistor and the Zener diode 3 is thereby coupled to a control terminal 27 of the semiconductor transistor 15, for example to a gate terminal of an IGBT if the semiconductor transistor 15 is an IGBT, the first power terminal 26 a collector terminal and the second power terminal 26 an emitter terminal of the IGBT. It can, however, also be possible to use a field effect transistor, for example a MOSFET, for the semiconductor transistor 15. In this case, the first power terminal 25 can be a drain terminal and the second power terminal a source terminal of the MOSFET.

The control terminal of the limiting transistor 5 is coupled to a voltage source 7 and is supplied with a control voltage by said voltage source 7. The control voltage produced by the voltage source 7 thus corresponds to a critical voltage for the voltage across the power terminals 25 and 26 of the semiconductor transistor 15. When said critical voltage is exceeded, the semiconductor transistor is temporarily switched to the conductive state in a reliable and precise manner. To this end, the limiting transistor 5 is used which receives the voltage from the first power terminal 25 at one of the power terminals thereof. In the event that an IGBT is used as the limiting transistor 5, said IGBT can, for example, be the collector terminal. If a voltage which exceeds the control voltage at the control terminal of the limiting transistor is now applied to the collector terminal, the limiting transistor is then switched to the conductive state. As a result, the control terminal 27 of the semiconductor transistor 15 is connected to the first power terminal 25 so that the semiconductor transistor 15 is temporarily short circuited and the electrical surge across the power path of the semiconductor transistor 15 can be reduced.

The limiting transistor 5 advantageously replaces a Zener diode, the breakdown voltage of which diode has a considerably higher tolerance range than the tolerance range of the activation voltage of the limiting transistor 5. The voltage source 7 can thereby be set relatively precisely to a determined critical voltage with the use of cost effective components.

Figure 2:
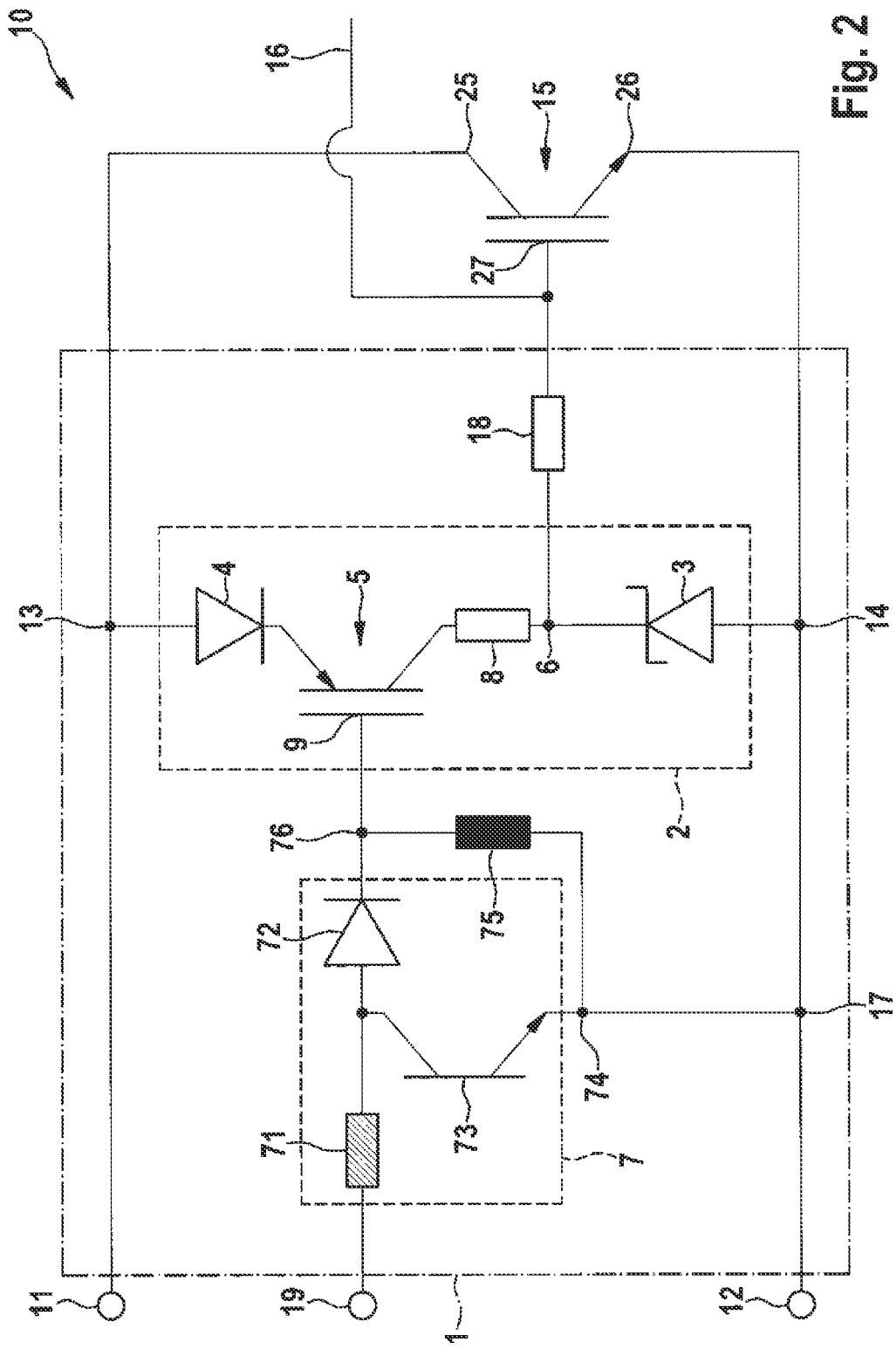
FIG. 2 shows a schematic depiction of a limiting circuit for a semiconductor transistor according to a further embodiment of the present invention.

FIG. 2 shows in great detail a schematic depiction of the limiting circuit 1 in FIG. 1 for a semiconductor transistor 15. Besides two current limiting resistors 8 and 18, which are coupled between the limiting transistor 5 and the control terminal 27 of the semiconductor transistor 15, FIG. 2 additionally shows an exemplary embodiment of a voltage source 7 as boost converter. The boost converter 7 has an input terminal 19 which is coupled via a storage throttle 71 and a free-wheeling diode 72 to a node 76 at the control terminal 9 of the limiting transistor 5. A switching transistor 73 having a node 17 at the second potential connection 12 is coupled between the storage throttle 71 and the free-wheeling diode 72. As a result, a voltage between the input terminal 19 and the second potential connection 12 can be boosted to a control voltage for the control terminal 9 of the limiting transistor 5. A different voltage source 7 can, however, also be implemented instead of a boost converter, preferably a simply constructed voltage source 7 which is implemented with cost effective components. In so doing, the input terminal 19 can be connected to a potential source or supply voltage of the system in which the limiting circuit 1 is used. The input terminal 19 can, for example, be connected to a low voltage on-board network of a motor vehicle.

The limiting circuit 1 further comprises a return path between the nodes 74 and 76, which has a return element 75. The control voltage is reduced in accordance with a predeterminable gradient across the return element 75, which can, for example, be an ohmic resistor or a parallel circuit consisting of an ohmic resistor and a capacitor.

In addition, the terminal of a driver circuit (not explicitly depicted) for the control terminal 27 of the semiconductor transistor 27 is denoted with the reference numeral 16, said driver circuit being designed to control the actual functional operation of the semiconductor transistor 27.

In the embodiment variants depicted in FIGS. 1 and 2, the semiconductor transistor 15 is shown in each case as a power semiconductor switch, for example in the form of an IGBT (insulated gate bipolar transistor). It is, however, also possible to use JFETs (junction field effect transistors), MOSFETs (metal oxide semiconductor field effect transistors) or BJTs (bipolar junction transistors) as the semiconductor transistor 15.

The limiting transistor 5 can likewise be implemented as an IGBT, JFET, MOSFET or BJT. By way of example, the limiting transistor 5 is depicted as a bipolar transistor in FIGS. 1 and 2.

Only a single semiconductor transistor 15 is shown in FIGS. 1 and 2, wherein the limiting circuit 1 is suited in principle for more than one semiconductor transistor. In particular, the limiting circuit 1 can be coupled to control terminals of a plurality of semiconductor transistors 15. This is advantageous in that only one single voltage source 7 is necessary in principle in order to perform the activation of the control terminals of a plurality of semiconductor transistors 15. In so doing, the increased costs for implementing the voltage source 7 can be offset by the savings in semiconductor for the individual semiconductor transistors 15.

The limiting circuit 1 in FIGS. 1 and 2 can, for example, be used in inverters for electrically driven farm vehicles or watercrafts, for example for hybrid vehicles. In systems having a large number of semiconductor transistors as switching devices, the limiting circuit can contribute by means of the improved control over the critical voltage to minimizing the required safety margin for the dielectric strength of the semiconductor transistors while reducing the semiconductor surface at the same time.

FIG. 3 shows a schematic depiction of a method 20 for limiting a voltage across a semiconductor transistor, for example the semiconductor transistor 15 in FIG. 1 or 2. In order to implement the method, the limiting circuit described in connection with FIGS. 1 and 2 can be used. The method 20 is suitable in particular for use in inverters for electrically driven farm vehicles or watercrafts, which have an electric motor as electric machine. Inverters used in such vehicles frequently comprise a large number of semiconductor transistors as switching devices which have to have a high dielectric strength due to the high voltages in the high voltage network of vehicles. By means of the method 20, the semiconductor transistors can be configured having a lower safety margin for the dielectric strength by controlling the critical voltage in a more exact manner, which advantageously leads to a reduction in the chip surface and therefore in the costs of the chips.

As a first step 21, the method 20 can optionally comprise a boosting of a supply voltage to a control voltage for a limiting transistor 5. In a second step 22, the control voltage is applied to the control terminal 9 of a limiting transistor 5. Said control voltage, which is permanently applied to the control terminal 9 of the limiting transistor 5, corresponds to a critical voltage which may maximally be present between the first power terminal 25 and the second power terminal 26 of the semiconductor transistor 15. If the potential applied to a power terminal of the limiting transistor 5, for example an emitter terminal, said potential corresponding to the potential applied to the first power terminal 25 of the semiconductor transistor 15, exceeds the critical voltage, the limiting transistor 5 becomes conductive. As a result, the semiconductor transistor 15 can temporarily be brought into a conductive state in a third step 23 in order to gradually reduce the voltage peaks or the electrical surge when a coupling via the activated limiting transistor 5 of the control terminal 27 of the semiconductor transistor 15 to the first power terminal 25 of said semiconductor transistor 15 occurs.

The invention claimed is:

1. A limiting circuit for at least one semiconductor transistor, the circuit comprising:
   a limiting path coupled between a first power terminal and a second power terminal of the semiconductor transistor and including a limiting transistor, wherein a node of the limiting path between the limiting transistor and the second power terminal of the semiconductor transistor is coupled to a control terminal of the semiconductor transistor;
   a voltage source, the voltage source comprising a boost converter which is designed to boost a supply voltage at an input terminal of the boost converter to the control voltage for the limiting transistor;
   wherein the voltage source is coupled to a control terminal of the limiting transistor, and
   wherein the voltage source is designed to supply a control voltage to the control terminal of the limiting transistor, the control voltage corresponding to a critical voltage for the voltage between the first power terminal and the second power terminal of the semiconductor transistor; and
   wherein the limiting transistor is switched to the conductive state when the critical voltage is exceeded at a power terminal of the limiting transistor.

2. The limiting circuit according to claim 1, wherein the semiconductor transistor is an IGBT, the first power terminal a collector terminal and the second power terminal an emitter terminal of the IGBT.

3. The limiting circuit according to claim 1, wherein the semiconductor transistor is a MOSFET, the first power terminal a drain terminal and the second power terminal a source terminal of the MOSFET.

4. The limiting circuit according to claim 1 further comprising a return path which is coupled between the control terminal of the limiting transistor and the second power terminal of the semiconductor transistor and which is designed to reduce the control voltage in accordance with a predeterminable gradient.

5. The limiting circuit according to claim 1, wherein the limiting transistor is a MOSFET, an IGBT, a JFET or a BJT.

6. A method for limiting a voltage across a semiconductor transistor, the method comprising:
   applying a control voltage, using a boost converter, to a control terminal of a limiting transistor which corresponds to a critical voltage for the voltage between a first power terminal and a second power terminal of the semiconductor transistor;
   switching the limiting transistor to a conductive state when said critical voltage is exceeded at a power terminal of said limiting transistor; and
   coupling a control terminal of the semiconductor transistor via the activated limiting transistor to the first power terminal of the semiconductor transistor.

7. The method according to claim 6, wherein the semiconductor transistor is an IGBT, the first power terminal a collector terminal and the second power terminal an emitter terminal of the IGBT.

8. The method according to claim 6, wherein the semiconductor transistor is a MOSFET, the first power terminal a drain terminal and the second power terminal a source terminal of the MOSFET.

9. The method according to claim 6, wherein the limiting transistor is a MOSFET, an IGBT, a JFET or a BJT.

10. A circuit arrangement comprising:
    a plurality of semiconductor transistors, each of the plurality of semiconductor transistors having a control terminal; and
    a limiting circuit according to claim 1, the node of the limiting path of said limiting circuit being coupled to each of the control terminals of the plurality of semiconductor transistors.

* * * * *